US008489368B2

(12) United States Patent
Klimmek

(10) Patent No.: US 8,489,368 B2
(45) Date of Patent: Jul. 16, 2013

(54) METHOD FOR DETERMINING THE DEFORMABILITY OF A BODY

(75) Inventor: Christian Klimmek, Froendenberg (DE)

(73) Assignee: Simuform GmbH, Dortmund (DE)

( * ) Notice: Subject to any disclaimer, the term of this patent is extended or adjusted under 35 U.S.C. 154(b) by 725 days.

(21) Appl. No.: 12/674,307

(22) PCT Filed: Aug. 20, 2008

(86) PCT No.: PCT/DE2008/001346
§ 371 (c)(1),
(2), (4) Date: Feb. 19, 2010

(87) PCT Pub. No.: WO2009/024130
PCT Pub. Date: Feb. 26, 2009

(65) Prior Publication Data
US 2011/0218778 A1 Sep. 8, 2011

(30) Foreign Application Priority Data

Aug. 20, 2007 (DE) .......................... 10 2007 039 337

(51) Int. Cl.
*G06F 17/10* (2006.01)
*G06F 7/60* (2006.01)

(52) U.S. Cl.
USPC .............................................................. 703/2

(58) Field of Classification Search
USPC .............................................................. 703/2
See application file for complete search history.

(56) References Cited

U.S. PATENT DOCUMENTS

| 6,101,450 | A | 8/2000 | Dasgupta | |
|---|---|---|---|---|
| 2001/0046140 | A1* | 11/2001 | Chase et al. | 362/549 |
| 2008/0123927 | A1* | 5/2008 | Miga et al. | 382/131 |

OTHER PUBLICATIONS

Miga 60859438 Provisional Patent Application Specification, Whole Document, Nov. 16, 2006.*
Heitz et al. (Statistical Shape model Generation Using non-rigid Deformation of a template mesh, 2005).*
International Search Report for PCT Patent Application PCT/DE2008/001346 dated Aug. 20, 2008.
International Written Opinion for PCT Patent Application PCT/DE2008/001346 dated Aug. 20, 2008.
International Report on Patentability for PCT Patent Application PCT/DE2008/001346 dated Aug. 20, 2008.

* cited by examiner

*Primary Examiner* — David Silver
*Assistant Examiner* — Andre Pierre Louis
(74) *Attorney, Agent, or Firm* — Eschweiler & Associates, LLC

(57) ABSTRACT

The invention relates to a method for determining the ability of an analysis body to change the shape thereof using mathematical models. The mathematical models are generated for geometric parameters, which are determined based on test experiments in which a reference body is reshaped or originally shaped in a defined manner. By means of the mathematical models, the ability of a test body to change the shape thereof is then calculated, for the geometry of which a finite element structure is available. For the geometry of the test body a shape factor is known, which characterizes said geometry. The ability of the test body to change the shape thereof is likewise calculated by a method based on the finite element method (FEM).

25 Claims, 13 Drawing Sheets

Figure 1:
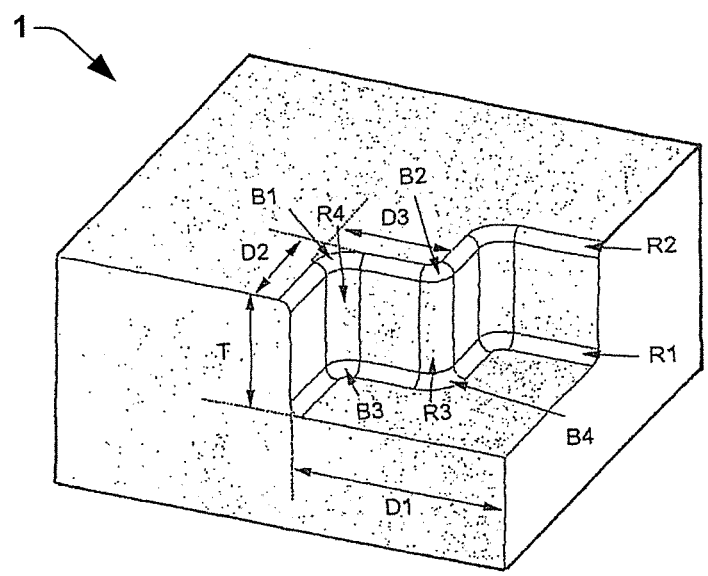

$$y_i = \beta_1 + \sum_{j=1}^{K} x_{cij}\beta_{j+1} + \varepsilon_i \qquad (1)$$

$$y_i = \beta_1 + \sum_{j=1}^{K} x_{cij}\beta_{j+1} + \sum_{j=1}^{K-1}\sum_{k>j} x_{cji}x_{cik}\beta_{j,k} + \varepsilon_i \qquad (2)$$

$$y_i = \beta_1 + \sum_{j=1}^{K} x_{cij}\beta_{j+1} + \sum_{j=1}^{K-1}\sum_{k>j} x_{cji}x_{cik}\beta_{j,k} + \sum_{j=1}^{K} x_{cij}^2\beta_{j,j} + \varepsilon_i \qquad (3)$$

Fig. 6

METHOD FOR DETERMINING THE DEFORMABILITY OF A BODY

RELATED APPLICATION

This application claims priority to International Application No. PCT/DE2008/001346 filed Aug. 20, 2008, which is entitled "Method for Determining the Deformability of a Body", which was not published in English, that claims priority to German Patent Application No. 10 2007 039 337.9 filed Aug. 20, 2007.

The invention relates to a method for determining the deformability of any desired examination body.

FEM technology, inter alia, has become established for the computer-aided examination of the deformability of bodies. According to a general approach of continuum mechanics, solid bodies become deformed or distorted when they are exposed to external loads and forces. These distortions then lead to interactions inside the body, to so-called internal stresses. Because of these internal stresses, the body is in a force equilibrium with the external loads acting on it. Every change in the external loads then leads to a different stress state is inside the body. By analogy herewith, it is possible to use approaches from mechanics in order to examine the deformability not of solid, but of fluid bodies (for example Newtonian fluids, viscous bodies, viscoplastic bodies, etc.). The finite element method (FEM) constitutes a numerical approximate method for solving so-called boundary value problems. FEM is used to calculate the reaction of the body and/or its internal stresses as a function of the external loads. A numerical calculation method can be used to approximate the action of the totality of the distortions, which is represented by a displacement vector field.

The geometry of the body is subdivided into finite elements in a calculation using FEM technology. It is possible on the basis of the calculation of the deformability of each individual finite element, and by taking account of the interaction with surface elements adjacent thereto to determine the deformability of the entire body as a result. However, it is a precondition firstly to map the entire geometry of the body in a FEM structure and to discretize it sufficiently accurately with regard to a calculation result that is as accurate as possible. This is costly in terms of time and computation effort.

In the case of highly complex geometries, even the numerical calculation methods based on the FEM method encounter their limits because of the required computational outlay. It is possible to reduce the number of required calculation cycles and, in so doing, simultaneously to increase the number of the parameters to be varied, without thereby renouncing information, by combining the FEM method with statistical methods, methods of statistical data evaluation, and with mathematical methods for modeling simulations with the aid of neural networks. Through combining these methods, it is possible to analyze a plurality of different parameters simultaneously, and to determine their effect on the deformability of the body to be examined. Methods are known for this purpose in which forecasting models in the form of so-called "Response Surface Models (RSM)" enable the evaluation of different parameters for an existing FEM simulation. In general, statistical forecasting models are capable of calculating and/or forecasting very accurate results on the basis of tests carried out systematically, or on the basis of a universe of data and/or relevant information from any desired source for a relevant range of values. The systematic creation of the database and/or the universe of information is done as a rule by using so-called experimental designs that can subdivide the range of values in a defined fashion and map them accurately.

The definition of the universe can also be performed in another way than by using experimental designs.

However, said methods including the statistical forecasting models have the disadvantage that they are dependent on a direct coupling to a respective FEM node. The results of the FEM simulations are linked to the respective node of the calculation model, which are then coupled in turn to a forecasting model that can then be used to represent the respective results exclusively for this node. This means that it is impossible either to use adaptive network refinement mechanisms, or to investigate methods in which different input variables such as, for example, external loads, boundary conditions and the like lead to different spatial coordinates of the networks and/or the nodes. Existing methods have so far been used on pure strength problems or so-called Euler problems, or in the analysis of structural mechanics, where only different load cases are to be investigated instead of a change in geometry.

DE 199 17 045 A1 describes a method for determining deformations and stresses of a total structure consisting of partial structures with the action of external forces, each of the partial structures consisting at least partially of a material that has plastically deformed in a forming process. In a first step of the method, a simulation using the finite element method (FEM) is used to determine which structural properties and stresses each subelement has on the basis of its primary forming in a forming process. In a second step of the method, the determined structural properties and the material properties of all partial structures are then introduced into a finite element simulation of the overall system such that it is possible in comparison to conventional simulation methods to achieve a more realistic simulation of the deformation of the overall system.

DE 195 16 463 A1 describes a method for determining optimized conditions for powder forging methods and for extruding powdery starting materials. In order to determine material properties of the powdery starting material, stress and expansion tests are carried out therewith in a first method step. The material parameters thus determined are used in a finite element simulation of the powdery starting material, it being possible in the simulation to take exact account, in particular, of boundary surfaces of the forging tool or of the extrusion tool.

DE 196 01 858 C1 describes a method for determining the yield strength of a steel in the case of which, starting from steels of known composition and yield strength, a neural network is used to forecast the yield strength of steels with a new composition not yet investigated. To this end, the neural network is trained with material properties and composition characteristics of already known steels. A particularly suitable neural network results in this case by designing the neural network as Multilayer Perceptron with a hidden plane that comprises approximately 80 to 120 nodes.

Accordingly, the object of the invention is to provide a method for determining the deformability of a body that employs mathematical models to ensure shortening of the computing time in conjunction with adequate accuracy of the result.

This object is achieved by a method having the features of claim 1. Advantageous developments of the invention are defined in the dependent patent claims.

An inventive method for determining the deformability of an examination body comprises the following steps:

i) acquiring the geometry of at least one test body and forming a finite element structure of the geometry of the test body, ii) assigning the test body to a specific geometric class, wherein a form factor that characterizes the geometry of the test body is allocated to the test body, iii) calculating the deformability of the test body on the basis of the finite element structure, iv) defined shaping of a reference body consisting of a selected material by means of a test experiment as a function of at least one process parameter, v) evaluating shaped regions of the reference body in order to determine geometric parameters, vi) decoupling the geometric parameters from absolute network coordinates of the reference body, the geometric parameters thereby being normalized, vii) creating a mathematical model in which the normalized geometric parameters, the at least one process parameter and a material specific parameter for the material of the reference body are combined, viii) calculating the deformability of the test body for a spatially defined region by means of a predetermined number of simulations based on the mathematical model from step vii), ix) comparing the result from step viii) with the result from step iii), x) repeating steps viii) and ix), a scaling of the normalized geometric parameters with a fit factor being respectively undertaken in step viii) until the result from viii) corresponds as well as possible to the result from iii), xi) linking the scaled parameters from step x) to the form factor from step ii) such that a matrix is formed therefrom, and xii) correlating the examination body with the form factor from step ii) such that the mathematic model based on the matrix from step xi) is transferred to the examination body in order to forecast the deformability thereof.

A substantial advantage of the inventive method resides in the fact that no considerable computing times are required to forecast the deformability of an examination body, because it is possible to correlate any desired examination body with the results for a test body that have previously been attained by steps x) and xi). This renders possible an interactive online process planning for an examination body, for example by using a computer system or the like. This permits a more efficient and, in particular, faster feasibility test than conventional methods, in particular with reference to a selection of materials and to process parameters.

The inventive method can be used to examine, for their deformability, both solid bodies and molten materials that are shaped in accordance with step iv) into a predefined shape. Correspondingly, in step iv) either a solid body or a molten body is deformed or subjected to primary forming in a defined fashion by means of the test experiment.

In order to deform the reference body in the form of a solid body, it is possible to use a matrix that, in a fashion adapted to the desired shape of the reference body, has defined regions of curvature with specific geometric parameters. With reference to the deformation of the reference body by means of the matrix, it is possible to assume a congruent mapping in which the reference body is applied with perfect fit to the surface of the matrix, in particular to the curved regions thereof. The result of this is that after it has been deformed the regions of curvature of the reference body correspond to those of the matrix. Consequently, in a fashion corresponding to its curved regions, the reference body then has geometric parameters that correspond to the geometric parameters of the matrix. The deformation of the reference body can be performed, for example, by deep drawing, forging, embossing or comparable forming methods. The resulting shape of the reference body is also a function of at least one process parameter with which the test experiment is carried out. For example, in a cruciform punch tensile test the process parameters can be formed from the retaining forces and/or from the holding forces, or from the initial sheet thickness of the reference body.

In the examination of a molten material, the term of deformability is understood to mean the capacity to fill a geometrically defined enveloping mold in interaction with the external loads and boundary conditions in the form of the at least one process parameter. When the test experiment is carried out, a molten material acquires its primary form, that is to say it is poured into a suitable mold or cavity that defines the resulting shape for the reference body. It may be assumed that when it is poured into the mold the melt fills up the cavity completely and without the inclusion of air, shrink holes or the like. Correspondingly, the shaping of the cavity defines the resulting shape of the reference body after removal from the cavity, the geometric parameters of cavity and shaped reference body corresponding to one another. The boundary conditions in the form of the at least one process parameter can consist of the temperature, the viscosity and the material composition of the melt, as well as of the flow condition during filling of the cavity and the cooling rate.

Data or items of information relating to the deformability of the reference body, that is to say the capacity to be formed or primary formed as a function of a specific material selected therefor are generated by means of the test experiment, in which a reference body is brought into shape in a defined fashion. For example, the deformability and the deformability of a reference body made from a specific material can be judged via a multiplicity of physical variables in the field of forming technology. For example, these variables include the determination of the sheet thickness distribution, the calculation of deformation states or the calculation of comparative deformation variables.

After an evaluation of the geometric parameters in step v), the latter are then decoupled from the absolute network coordinates of the reference body, for example with the aid of the total differential of the local curvature of the respective deformed regions. In other words, the decoupling from the network coordinates is performed by an orientation to local curvatures, depths and distances that can be determined in relation to the defined component edge. Coordinates that are absolute for the reference body and represented in space are thereby replaced by local geometric relationships inside the reference body itself. In addition, discrete finite elements of the deformed regions can be allocated a local depth in order as a result to map a 3D body. This decoupling of the geometric parameters from absolute network coordinates of the reference body subsequently creates a mathematical model that combines the normalized geometric parameters, the at least one process parameter and a material specific parameter that results from the material of the reference body. Such a mathematical model makes a statement on the deformability of the reference body.

The accuracy of the mapping quality is raised by virtue of the fact that a plurality of different test experiments are carried out in which the at least one test parameter (for example holding force), geometric dimensions of, for example, a punch, and/or the material for the reference body can be varied. This applies analogously to a primary forming of the reference body, for example pouring of a molten material into a cavity, it being possible to vary the test parameter, for example with reference to the temperature of the melt. Such a variation of the test experiments produces a multiplicity of different geometric parameters that are then combined in step vii) in a separate mathematical model in each case. A dedicated mathematical model is required for each physical variable that represents a statement on the deformability of the test body. It follows from this that the number of the mathematical models for a reference body is yielded by the number of the mathematical models for the geometrically uniquely defined regions multiplied by the number of the physical variables that describe the deformability of the reference body. It is hereby possible to take account of each physical variable that permits a reference to the deformability of the reference body.

Consideration is given as test experiment to any experiments that describe the formability of materials and/or also their capacity for primary forming. With reference to solid bodies, these test experiments can be formed from a deep drawing test, a cruciform punch tensile test, a Marciniak test, a Nakazima test or is similar test experiments that represent the forming behavior of a material in a forming limit diagram. It is to be recommended to use an experimental design in step iv) in order to investigate different geometries and/or to deform and/or primary form the same reference body with other process parameters such that a wide range of geometric parameters is covered with reference to conditions of curvature, component depth and the like. This is then followed in steps v) and vi) by corresponding normalization of the different geometric parameters.

The carrying out of mutually deviating test experiments is preferably performed on the basis of statistical experimental design, in order therefrom to generate a plurality of parameter combinations, and thus to create a plurality of corresponding mathematical models. It is expedient for this plurality of mathematical models to be stored in a database from which they can be correspondingly retrieved as a function of a specific test body and/or a selected examination body. This permits a rapid access and a rapid transfer of the respective mathematical models to a geometry of a specific examination body. The mathematical models can be used to this end to output an accurate feasibility forecast for any desired parameter variations and materials in a short time. For this purpose, the mathematical models are transferred with the aid of a user-friendly user interface to the geometry of the test body and/or of the examination body. The corresponding target variable can be displayed in a false color representation on a monitor.

A test body is provided irrespective of the shaping of the reference body, a finite element structure being formed with reference to the geometry thereof. The proportions of the geometry of a test body correspond approximately to the proportions of an examination body that is, finally, to be examined. Each test body is assigned to a specific geometric class, the test body being allocated a so-called form factor that characterizes the geometry of the test body. The form factor respectively defines a dedicated geometric class for different test bodies, a statement thereby being made with reference to the macrogeometry of the test body. After a finite element structure is formed for the test body, this is used as a basis for calculating the deformability of the test body.

After both in step vii) at least one mathematical model has been created and, in parallel therewith, the deformability of the test body has been calculated in accordance with step iii) on the basis of the finite element structure, the deformability of the test body is subsequently calculated in step viii) on the basis of the mathematical model with the aid of a predetermined number of simulations. The result of this is subsequently compared with the result from the FEM calculation. Steps viii) and ix) are carried out repeatedly if there is a difference between the result from step viii) and step iii), a scaling of the normalized geometric parameters with a fit factor being respectively undertaken when calculating the deformability of the test body with the aid of the mathematical models. In other words, the fit factors that are used to correct the normalized geometric parameters are scalar variables. The repetition of steps viii) and ix) is carried out until the result of the respective calculations of the deformability on the basis of the mathematic model (step viii)) and on the basis of the finite element structure (step iii)) correspond as well as possible. The method of least error squares, for example, is suitable for this. However, it is also possible to make use of other methods with the aid of which such checking is possible, for example other calculation methods for determining optima.

After the normalized geometric parameters are corrected with the aid of the fit factors in step x), they are linked to the form factor from step ii) such that a matrix is formed therefrom. This matrix then forms a basis for undertaking a correlation with the examination body. In the process, the examination body is related to the form factor of the test body from step ii) such that the at least one mathematical model based on the matrix from step xi) is transferred to the examination body in order to forecast the deformability thereof. This has the advantage that the examination body need not be calculated in detail with reference to its geometry, an unacceptably long calculation period and unacceptably large outlay on calculation thereby being avoided. Instead of this, the examination body is linked to the matrix from step xi) such that data thereof (linking of the scaled normalized geometric parameters), together with the form factor from step ii), permit the deformability of the examination body to be is forecast. Access to the matrix from step xi) allows very short access times in conjunction with a short computation period and a unique assignment to a respective examination body without the need to recalculate geometry thereof completely. The matrix from step xi) is expediently stored in a suitable database, this database being accessed when carrying out step xii).

In order to ensure a high accuracy of the mathematical models when a spatially defined region of the test body is calculated with reference to the deformability in step viii), it is advantageous to have a plurality of mathematical models that respectively include different geometric parameters in order to cover a wide range of parameters. This can be performed, on the one hand, by modifying the test experiment in step iv) in order to deform and/or primary form the reference body in a defined fashion and thereby to attain different deformations and/or shapings of the reference body, different geometric parameters resulting therefrom. These respectively different geometric parameters are then combined together with the associated process parameters and a corresponding material specific parameter to form a respective forecasting model. The plurality of such mathematical models ensures in this case that specific shapings of a test body and/or corresponding regions of curvature or the like are mapped therein sufficiently accurately. The plurality of mathematical models are combined in a set, a so-called cluster. Such a cluster is to be understood as a matrix in which the individual mathematical models are combined. It is thereby possible to make a respectively accurate mathematical model available for a respectively required parameter combination of the test body, that is to say in a fashion adapted to a specific shaping with specific regions of curvature.

A further possibility for raising the forecasting accuracy consists in the fact that interpolation or extrapolation is undertaken on the basis of two mathematical models. This means that a further mathematical model is determined by computation on the basis of two already determined mathematical models for which the individual geometric parameters are defined. This can preferably be performed with polynomials of higher degree (for example of third degree), in order to take account of nonlinear interactions of the deformability of the test body. The computational determinations with the aid of these polynomials, for example of third degree, are performed with the aid of I-optimal or D-optimal experimental designs. As a result, there are then included in the purely computationally determined mathematical models further geometric parameters that ensure a yet more accurate adaptation to the geometry of the test body.

In the inventive method, the mathematical models serve the purpose of providing a high mapping accuracy for a specific geometric type of a test body. This can be performed by a plurality of mathematical models that include different geometric parameters in a fashion adapted to different regions of curvature of the test body. Such mathematical models can also optionally be determined purely by computation by using two already present mathematical models as a basis for undertaking interpolation or extrapolation. It follows that with reference to a solid body the mathematical models can describe the displacement vector field of the test body in a fashion which fits its local component geometry. As an alternative to statistical forecasting models, it is also similarly possible to use forecasting models that are based on a neural network. The use of neural networks is advantageous whenever the number of tests from a basic experimental design is large. So-called secondary shaped elements of the test body, that is to say geometric deviations from a standard basic shape, can be taken into account and/or corrected by said fit factors with the aid of which the normalized geometric parameters are scaled in step x). Overall, the use of the mathematical models renders it possible, for example, to forecast an action of the displacement vector field with reference to solid bodies as a function of the fabrication method used.

In an advantageous development of the invention, when carrying out step vii) each geometric parameter that corresponds to a discrete region of curvature of the reference body can be varied in an isolated fashion. A mathematical submodel is created on the basis thereof in conjunction with the remaining parameters, this submodel correspondingly being considered in the calculation of the deformability of the test body in step viii). The mathematical submodel is a forecasting model in the conventional sense that is determined for geometric parameters with a finer discretization. This leads to a yet better adaptation to the shaped part geometry of the test body, and thus to a yet higher mapping accuracy.

In an advantageous development of the invention, the mathematical model from step vii), and/or the mathematical submodel can be a statistical forecasting model or a model based on a neural network. A statistical forecasting model is a model whose data source has been generated on the basis of a statistical experimental design. The data generated can optionally be founded on a normalized normal distribution. The repeated carrying out of the test experiment in accordance with step iv) can be performed with the aid of a statistical experimental design such that at least one statistical forecasting model or a plurality of such models are subsequently created from the data or the geometric parameters of the shaped reference body, which are obtained therefrom.

In an advantageous development of the invention, steps i) to iii) can be carried out for various test bodies, each test body corresponding to a dedicated geometric class. Consequently, a plurality of test bodies are provided, each of which belongs to another geometric class because of its different shaping. A geometric class is to be understood as a group of components that can be approximated by the same fit factors and form factors. Following a repetition of steps i) to iii), steps vii) to xii) are carried out for a respective test body. The corresponding results of this are then stored in a database, in particular the matrix from step xii), such that a plurality of forecasting models are linked in this database to a corresponding form factor for various test bodies. In order to forecast the deformability behavior of an examination body it is then possible to have recourse to this database, the examination body being corrected in accordance with step xii) with the aid of the form factor of an associated test body from step ii).

In an advantageous development of the invention, a normal direction vector that defines a material specific anisotropy can be determined for the reference body. The selected geometric parameters are referred to the normal direction vector such that here the deformation behavior of the reference body with reference to the anisotropy thereof is taken into account. The result of this is a high mapping accuracy of the inventive method, in particular taking account of practical production methods.

A finite element structure is likewise known for the geometry of a respective examination body. In addition, a form factor is known for the geometry of the examination body—in a way analogous to the geometry of the test body. Consequently, the matrix from step xi) can be applied in step xii) to the finite element structure of the examination body. Deviations and/or differences between the examination body and the test body are taken into account by a quotient of the two form factors of these two bodies, in order to ensure a sufficiently high mapping accuracy for the examination body and the deformability thereof.

The statistical forecasting models can also be used for the purpose of transferring the calculated target variables to a network topology, which can be used, for example, for crash simulations. A finite element structure is likewise formed for the examination body, each surface element being allocated a predetermined permissible limit value, for example for a sheet thickness or the like. After step xii), that is to say when the examination body has been linked to the matrix from step xi), a check of the correspondingly predetermined limit value is carried out for each surface element of the examination body. If the predetermined limit value for a respective surface element of the examination body is undershot, a conclusion is drawn regarding at least one normalized geometric parameter of a respective statistical forecasting model such that the geometry of the examination body can be appropriately adapted. This is understood within the scope of the invention as an inverse use of the statistical forecasting models. In conjunction with crash simulations, the advantage results that in conjunction with the determination of the target variables from the feasibility it is possible for a component to be designed in parallel for the crash region during vehicle planning, and this leads to a significant time saving. By contrast herewith, conventionally long calculation times and design cycles are required before a start can be made with the actual crash simulation.

Furthermore, the statistical forecasting models can be used throughout production engineering where recourse is made to an existing universe of data and information, in order therefrom to derive forecasting models and transfer the latter to virtual computer models. In this way, information can be transferred from the real process to a virtual computer model. One possible field of application for this is the determination of shape deviations from springback effects in the fabrication of sheet metal parts. Another area of use can be the determination of the degree of shrinkage in the case of forgings or primary formed parts (castings), or the degree of shrinkage upon the solidification of melts during primary forming methods. The data for determining these models can also originate from highly accurate calculations in the same way as from practical experiments.

The topology analysis in accordance with steps v) and vi) constitutes an examination of the geometry with regard to the regions of curvature and depth distributions in the component, and examination and determination of the distances of the respective regions from the component edge. The data and/or geometric parameters obtained from this topology analysis can also be used in conjunction with corresponding mathematical models, for example in the form of statistical forecasting models, in order, for example, to forecast the tool wear in production engineering after a defined number of strokes in forging processes or deep drawing processes. When forecasting the tool wear, the mathematical models are not based on physical variables that can describe the deformation behavior, but instead on such as can describe the wear behavior of the tools being used. These physical variables include the contact normal stresses on the surfaces of the bodies (for example the test body), which can be analogously determined with the aid of the FEM. These physical variables can then be correlated with formulae that are known from the literature. When determining the tool wear, it is therefore possible to incorporate analytical calculations from is the literature into the statistical forecasting models as target variables, in order to determine the wear. In this case, the topology analysis is linked to the forecasting models and applied to a production method that is determined substantially from the combination of tool geometry, material and method parameters. As a result, it is possible by using the mathematical models or the statistical forecasting models to describe in a way similar to the description of the deformability of a metallic body the wear behavior of a loaded body that represents a tool.

In an advantageous development of the invention, individual method steps can be undertaken with the aid of a computer or the like, in particular the method steps in which a deformability of a body is calculated. The results of such calculations are then expediently stored in suitable databases or the like such that the results are available for further processing or else for later retrieval. It is preferred to execute these known method steps as a computer program with program code means on a computer or an appropriate arithmetic unit. Program code means can be stored on a computer-readable data medium in this case.

Further inventive advantages are as follows:
possible quality planning as early as in product development,
process improvement with the aid of statistical methods,
localization and display of zones of an examination body that are critical for forming, in conjunction with a very short computing time,
no FEM analysis of the examination body required,
process analysis can be performed in real time and interactively without substantial calculating times,
provision of proposed changes with regard to geometry, material and process management without substantial calculating times in the forecasting of the deformability of an examination body.

It has to be understood that the features named above and those still to be explained below can be used not only in the respectively specified combination, but also in other combinations or on their own without departing from the scope of the present invention. The invention is illustrated schematically below with the aid of a plurality of embodiments shown in the drawings, and is described in detail with reference to the drawings.

Figure 2:
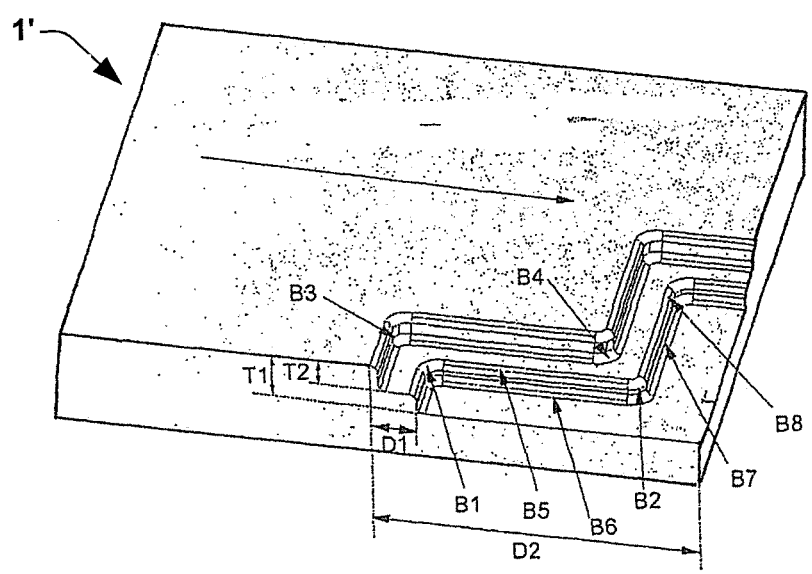
Figure 3A:
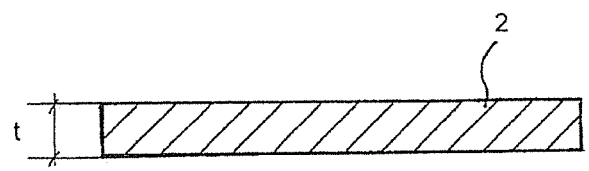
Figure 3B:
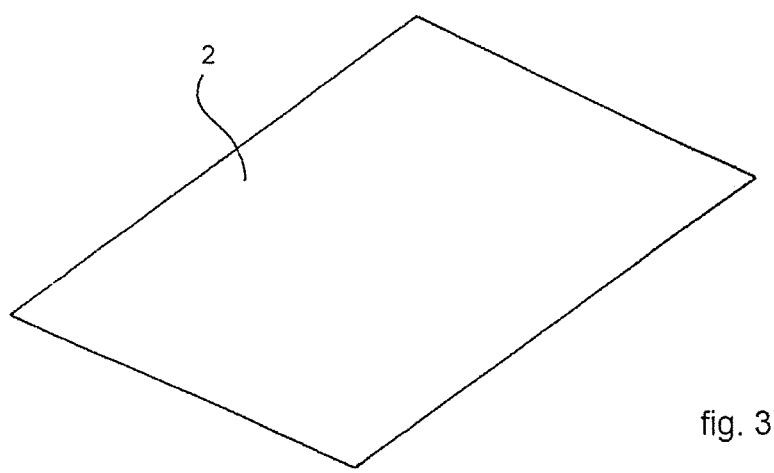
Figure 4:
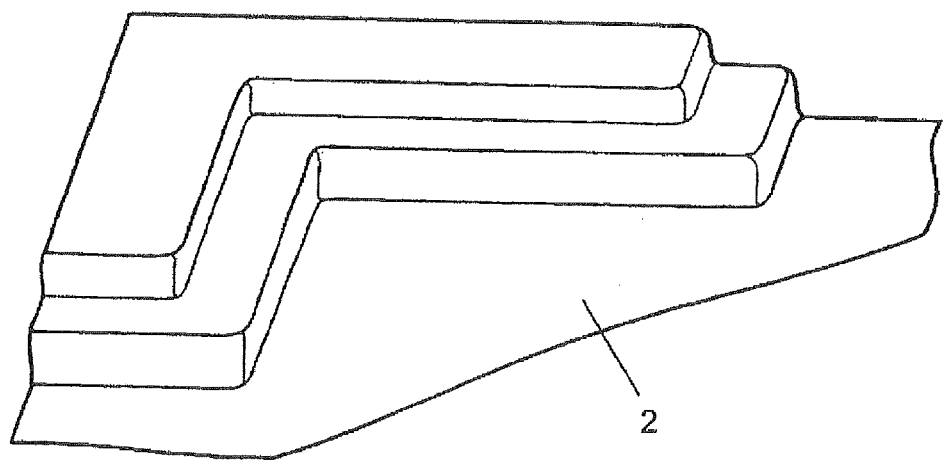
Figure 5A:
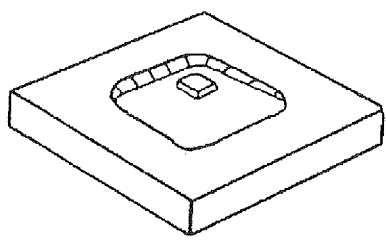
Figure 5B:
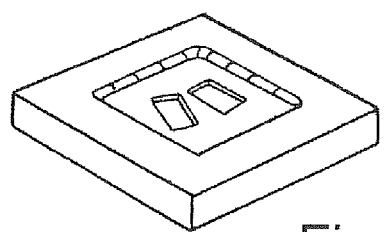
Figure 5C:
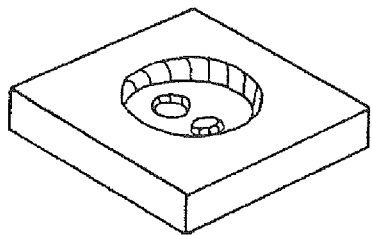
Figure 5D:
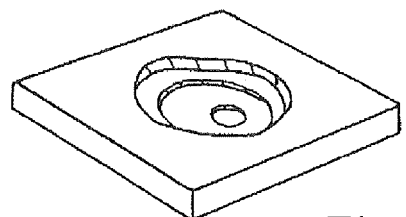
Figure 7:
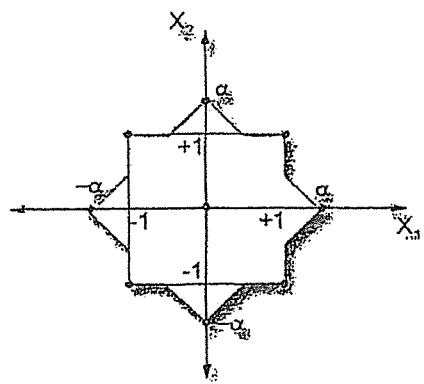
Figure 8:
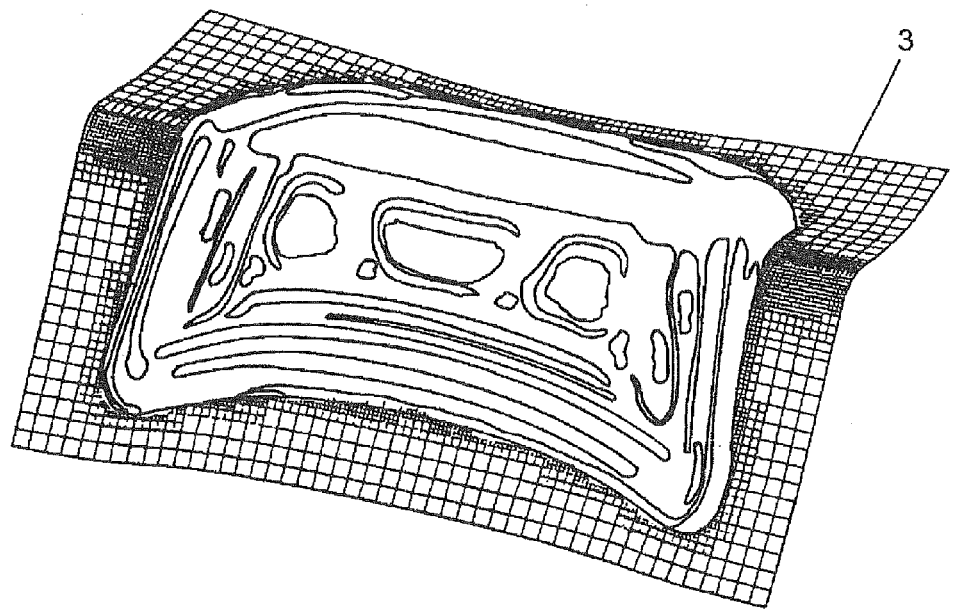
Figure 9:
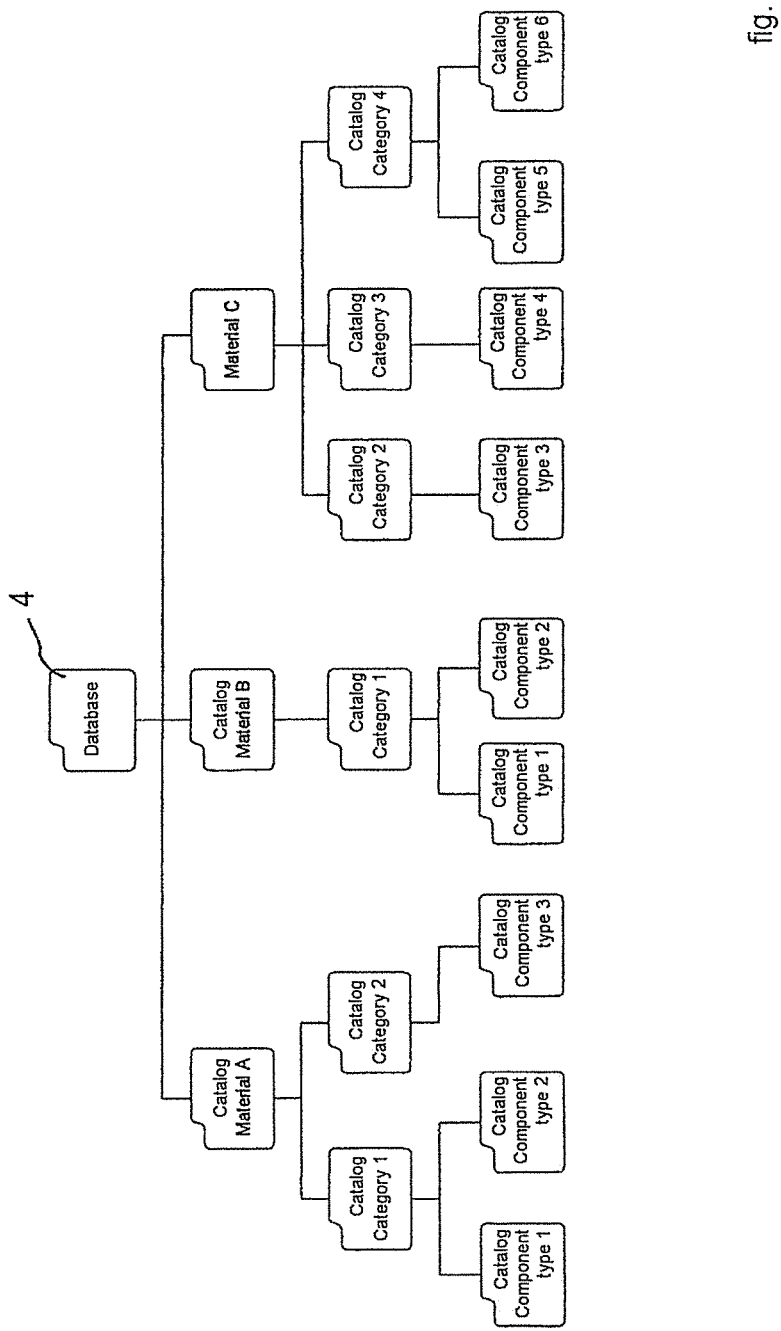
Figure 10:
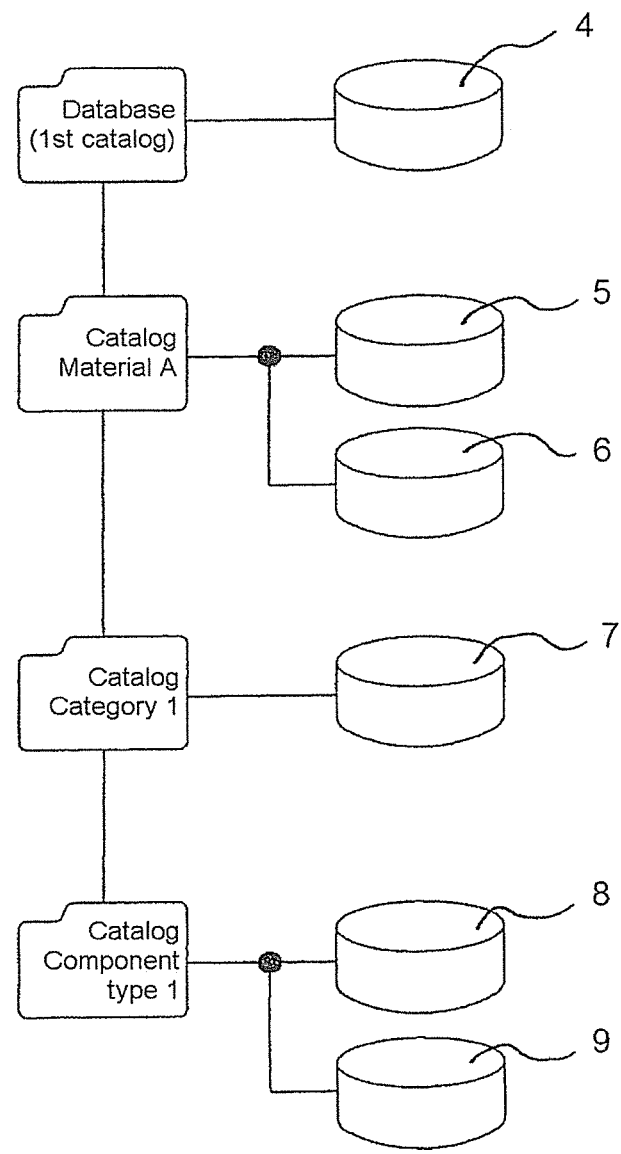
Figure 11:
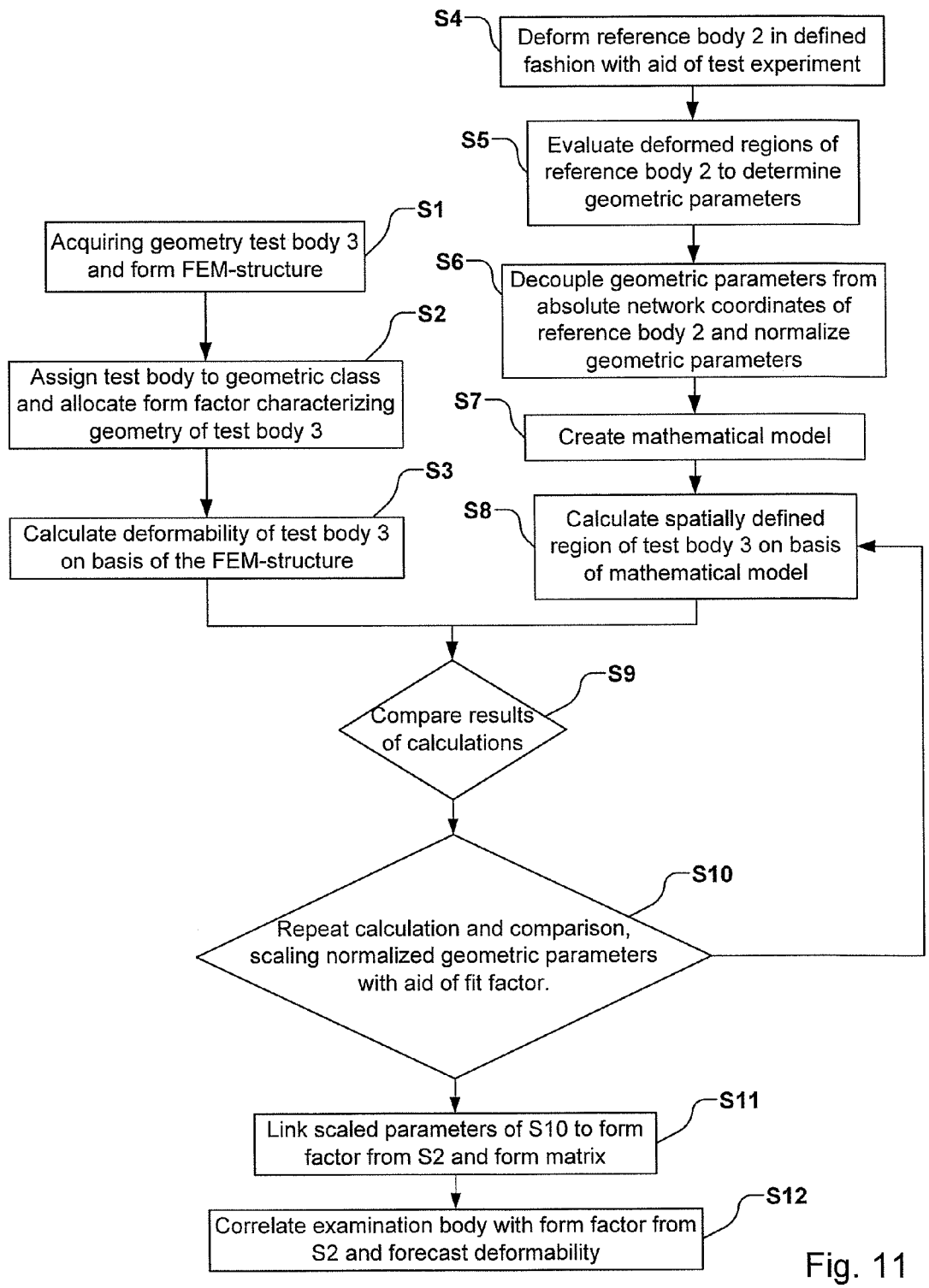
Figure 12:
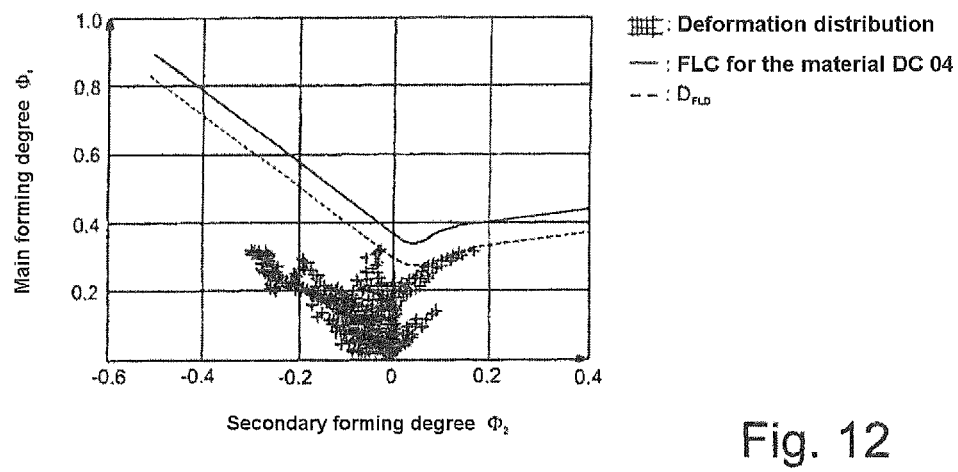
Figure 13:
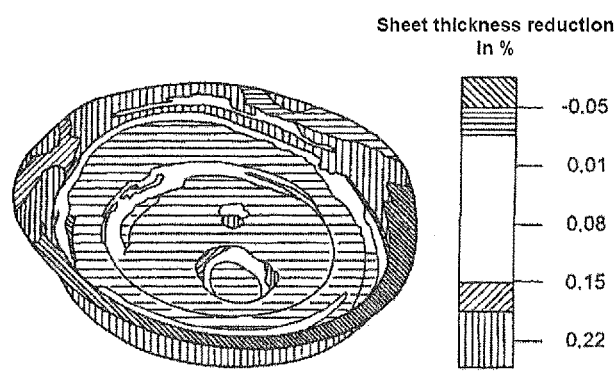
Figure 14:
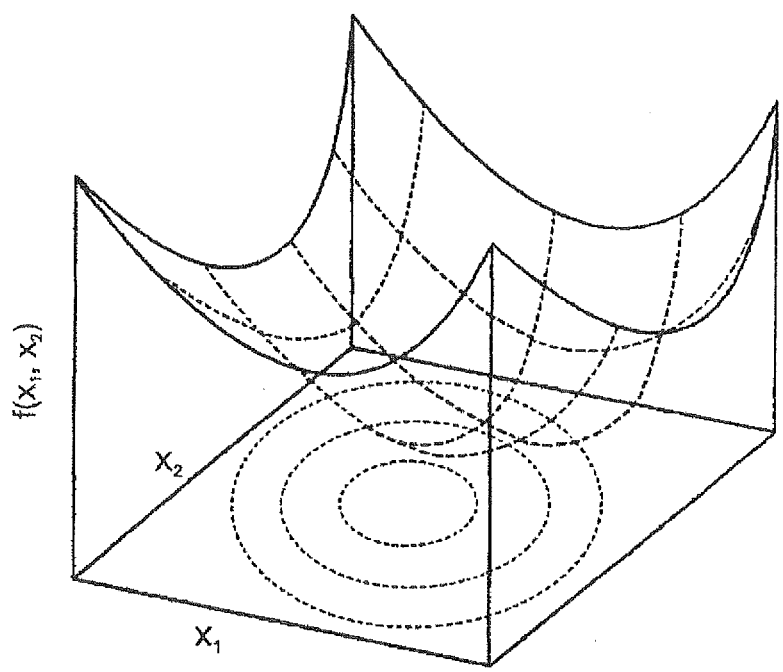
Figure 15:
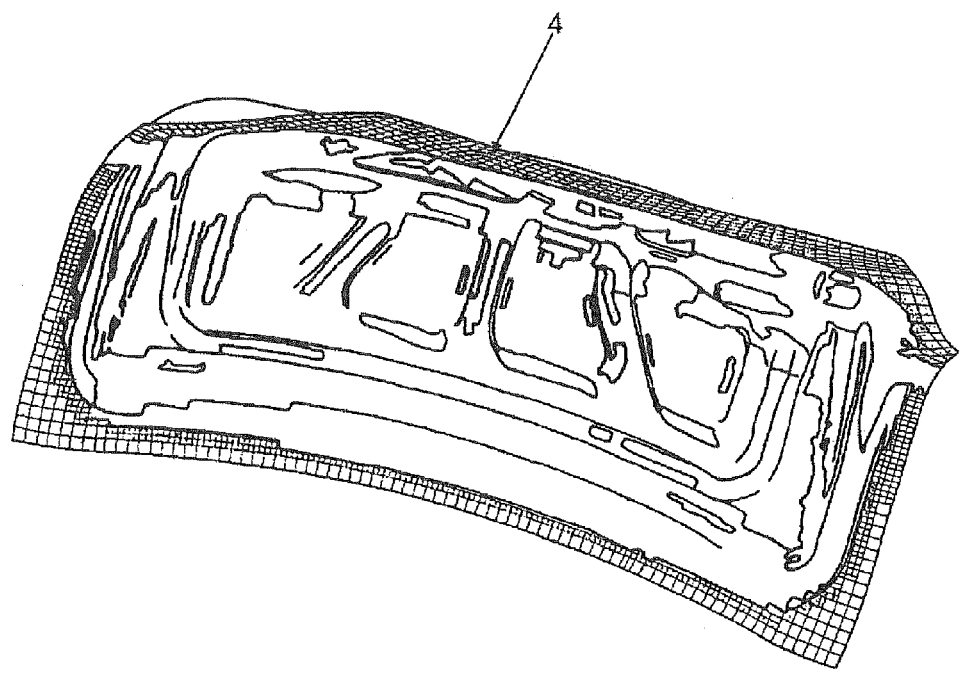

In the drawings:
FIG. 1 shows a selection of geometric parameters on a cruciform punch model,
FIG. 2 shows a selection of geometric parameters on a double cruciform punch model,
FIGS. 3a, 3b show a reference body in the nondeformed state in a cross-sectional view and a perspective view, respectively,
FIG. 4 shows the reference body from FIG. 3a and FIG. 3b after a deformation with the aid of a double cruciform punch,
FIGS. 5a-5d show further examples of geometric variations for a deep drawing test,
FIG. 6 shows various equations for determining forecasting models,
FIG. 7 shows a statistical experimental design for determining statistical forecasting models,
FIG. 8 shows a perspective view of a test body in the form of a tailgate of a motor vehicle based on a finite element structure,
FIG. 9 shows a hierarchical structure for storing data of a reference body and a test body in a data memory,
FIG. 10 shows a segment of the hierarchical structure from FIG. 6,
FIG. 11 shows a flowchart for the steps of the inventive method,
FIG. 12 shows a limit deformation diagram,
FIG. 13 shows the result of a finite element simulation,
FIG. 14 shows a matrix with the aid of a 3D model in accordance with step xi) of the inventive method, and
FIG. 15 shows a perspective view of an examination body in the form of a tailgate of a motor vehicle based on a finite element structure.

Aspects on which the invention is based, and individual steps of the inventive method and the method itself are explained in detail in FIG. 1 to FIG. 15.

FIG. 1 shows a perspective view of the geometry of a matrix 1 for a cruciform punch (not shown) in the quarter model. The matrix 1 has a plurality of geometric parameters that are adapted to the shaping of the cruciform punch. In detail, these geometric parameters are:
R1: arc radius,
R2: lead in radius,
R3: radius outer face,
R4: radius inner face,
B1: concave-convex region of curvature,
B2: convex-convex region of curvature,
B3: concave-concave region of curvature,
B4: convex-concave region of curvature,
T: depth of the cruciform punch,
D1: length of the cruciform punch,
D2: face width of the cruciform punch, and
D3: cross dimension of the cruciform punch.

The matrix 1 serves the purpose of forming a reference body in the form of a blank 2 (FIGS. 3a and 3b) in order to determine the formability or the deformability of the blank. FIG. 3a shows a cross-sectional view of the blank 2, and FIG. 3b shows a perspective view of a blank 2. The blank 2 is always referred to below as reference body.

The reference body 2 to be formed has an initial sheet thickness t (FIG. 3a), and is placed onto a bearing surface of the matrix 1 before being deformed. Subsequently, the reference body 2 is formed into the matrix 1 with the aid of the rigid cruciform punch. In a fashion conditioned by the shaping of the cruciform punch, all the deformation regions can be mapped in a deformation diagram from deep drawing via uniform uniaxial tension as far as stretching. Owing to alternating concave and convex corners in plan view, regions with pronounced tangential tensile and compressive stresses occur alternately during the forming operation. As occasioned by the conditions of curvature, different deformation states are achieved at the regions of curvatures B1 to B4 and permit a complete investigation of the material behavior with regard to its deformability and with regard to its interaction with the specified geometric parameters. Various process parameters for carrying out tests come into consideration for the deformation of the reference body 2 with the aid of the cruciform punch. Firstly, the material selected for the reference body 2 influences the deformability and/or the resulting deformed regions of the reference body 2. The deformability is, furthermore, dependent on the anisotropy of the selected material, and this is expressed, for example, by anisotropy values r0, r45 or r90. A further process parameter consists of the initial sheet thickness t of the reference body 2, and also of a holding force NH with which the reference body is clamped during deformation between the matrix and a blank holder. Finally, a coefficient of friction of the tools used forms a further process parameter, said coefficient of friction being influenced by the material of the matrix and/or of the cruciform punch.

As an alternative to the matrix of FIG. 1, it is also possible to use a matrix 1' in accordance with FIG. 2 for the cruciform punch test. This matrix 1' serves for a cruciform punch test in which a scaled small cruciform punch is introduced centrally into the matrix inside a large cruciform punch. Thus, what is involved here is a punch-in-punch test, also denoted below as a double cruciform punch test. The geometric design of the small punch inside the large punch is analogous to the punch in accordance with FIG. 1. Such a double cruciform punch permits the influence of secondary shaped elements inside the cruciform punch to be investigated. The respective geometric parameters of the matrix 1' are illustrated in the perspective view of FIG. 2, to which there belongs in detail:

B1: concave-convex region of curvature,
B2: convex-convex region of curvature,
B3: concave-concave region of curvature,
B4: convex-concave region of curvature,
B5: convex-flat region of curvature,
B6: concave-flat region of curvature,
B7: flat-concave region of curvature,
B8: flat-convex region of curvature,
T1: total depth of the double cruciform punch,
T2: depth as far as the first step of the double cruciform punch,
D1: distance of the step from the edge, and
D2: total width of the double cruciform punch.

In the same way as for the single cruciform punch test, consideration is given as processor parameters in the case of the double cruciform punch test to the material characteristics such as flow stress kf and the anisotropy values r0, r45 and r90, the initial sheet thickness t, the holding force NH and the coefficient of friction of the tools used.

It is assumed that there is a congruent mapping with reference to a deformation of the reference body 2 with the aid of the matrix shown in FIG. 1 and FIG. 2.

What is to be understood here is a uniform application of the reference body 2 to the surface of the matrix such that the shaping of the matrix and, in particular, its curved regions is transferred to the reference body. Because of this congruent mapping, the geometric parameters of the matrix can be transferred onto the deformed reference body.

FIG. 4 shows in a perspective view a segment of the blank 2 after a deformation with the aid of a double cruciform punch using a matrix 1' in accordance with FIG. 2. Clearly to be seen are the steps of the deformed blank 2, which steps are based on the geometric parameters T1 and T2 of the matrix 1'.

Because of the abovenamed congruent mapping, the deformed regions of the reference body 2 correspond to the geometric parameters of the matrix such that these regions can also be allocated the geometric parameters of the matrix.

As an alternative to the forming test with the aid of a cruciform punch in accordance with FIG. 1 or a double cruciform punch in accordance with FIG. 2, it is possible to use any other desired test experiment for forming, or else for primary forming a reference body, for example a deep drawing test, Marciniak test, a Nakazima test or the like. The only decisive factor is that these test experiments are able to reproduce the formability of, or the capacity to primary form, the reference body in a forming limit diagram. Examples of deep drawing tests with changed geometries are shown in the perspective views in accordance with FIGS. 5a-5d.

Following the deformation of the reference body 2, its geometric parameters are decoupled from absolute spatial coordinates so that there is no need for a discretization of the geometry of the reference body 2 with networks and nodes. This decoupling is performed by determining and evaluating the conditions of curvature of the reference body after its deforming, taking account of the total differential of the local curvature and of the main curvature and secondary curvature. If the deformation of the reference body 2 is carried out with the aid of the double cruciform punch, the conditions of curvature inside the topology are structured in a concave-convex or convex-concave fashion with the aid of the regions of curvature. The result of this is a cartographic division of the reference body alone with the aid of the conditions of curvature, the boundaries between different conditions of curvature being illustrated as continuous lines (boundaries). Within a region of curvature, it is still optionally possible to subdivide using isometric lines if the curvature of the corresponding region is not constant. This subdivision can be performed with the aid of a mathematical submodel. Particularly in the case of more complex components, such a further subdivision of the regions of curvature can be done using isometric lines and is also worthy of recommendation because of the complex curvature contexts, in order to attain a higher mapping accuracy as a result. In addition, use is made of a local depth in order to analyze the geometry of the deformed reference body 2. To this end, before the geometric analysis, the reference body is brought into a position fit for deep drawing (without undercuts). The combination of the local depth with the local regions of curvature results in a yet more accurate topology description.

As an alternative to the deformation of a reference body with the aid of the matrix shown in FIG. 1 or in FIG. 2, it is also possible to produce a reference body by pouring a melt into a mold or a cavity. The shape of the cavity in this case determines the shaping of the reference body subsequently removed from the cavity after cooling of the melt, it being assumed that the cavity is filled up acceptably by the melt without air inclusions, shrink holes or the like.

Creation of a mathematical model on the basis of the double cruciform punch is explained below. The mathematical model can be a statistical forecasting model, or a model based on a neural network, without a need to understand any restriction thereto. It has to be understood that creation of a mathematical model (for example statistical forecasting models, models based on a neural network or the like) can also be performed on the basis of the single cruciform punch test or any other desired test experiment to deform the reference body, as long as the limit deformability of the reference body can be reproduced in these tests.

A mathematical model is always denoted below as a statistical forecasting model without this needing to be understood as a restriction to only this type of model.

The statistical forecasting models can be formed on the basis of equations 1-3 that are shown in FIG. 6. Such forecasting models are known from classical experimental design and explained in detail in, for example, "Statistische Methode zur Qualitätssicherung und—optimierung" ["Statistical method for quality assurance and quality optimization"], Claus Weihs and Jutta Jessenberger, ISBN 3-527-29617-4. It has to be understood that the forecasting models for approximating the deformability of the reference body can also be used in any other form.

Equation 1 in accordance with FIG. 6 represents a model with main effects. The model coefficients used herein are, in detail:

$\beta_1$: intercept (axial segment),
$X_{cij}$: process parameter (coded value),
$\beta_{j+1}$: half effect,
$\epsilon_i$: error of the ith test.

Equation 2 takes account of a model with twofold interactions, the model coefficients included herein corresponding to those of equation 1.

Equation 3 takes account of effects in quadratic form for an optimization, the model coefficients including herein being determined as follows:

$\beta_1$: intercept (axial segment),
$X_{cij}$: process parameter (coded value),
$\beta_{j+1}$: coefficient of the jth factor,
$\beta_{ij,k}$: interaction coefficient j-k,
$\beta_{jk,k}$: squared interaction coefficient k-k,
$\epsilon_i$: error of the ith test.

All geometric parameters that belong to a test experiment or to the double cruciform punch test are combined in a forecasting model in conjunction with the associated process parameters and a material specific parameter that describes the material of the reference body. The double cruciform punch test has the advantage of being able to take account of the influence of nonlinear leaning paths. Furthermore, in the case of the double cruciform punch the influence of the distance from the edge of the step of the double cruciform to punch can be acquired in the form of the geometric parameter D1. A variation in this parameter D1 for various double cruciform punch test experiments enables quantification of the influence of this edge region on the deformability of the reference body 2 in the region of the inner punch.

is In the case of the double cruciform punch, the material anisotropy is taken into account by the regions of curvature B5/B8 and B6/B7, and this is of great significance in the field of sheet-metal forming.

It must be possible for the individual parameters that are integrated in a forecasting model, for example in accordance with one of equations 1-3, to be uniquely identified during transfer of the forecasting models onto any other desired geometry. The abovenamed geometric parameters in accordance with the matrix of FIG. 1 or FIG. 2 are uniquely identifiable parameters for the geometry and for the process management during deformation of the reference body.

In order to increase the number of forecasting models, the double cruciform punch test can be carried out with modified geometric parameters and/or with changed process parameters. Combinations of the respectively associated geometric parameters and process parameters are then respectively allocated to a specific statistical forecasting model. In a complementary or alternative fashion thereto, it is possible on the basis of two already determined forecasting models to determine further forecasting models in a purely computational fashion with the aid of interpolation or extrapolation. To this end, I-optimal or E-optimal experimental designs are used for the systematic variation of all the geometric parameters. An example of such an experimental design is shown in FIG. 7. The abbreviations for the coded values in the table have the following meanings:

$D_M$: diameter of the matrix
$H_N$: height of the secondary shaped element
$R_N$: lead in radius of a pocket-shaped secondary shaped element
$S_0$: initial sheet thickness Reference may be made to "Statistisch unterstützte Methodenplanung für die Hochdruck-Blechumformung" ["Statistically supported method planning for high pressure sheet metal forming"], Christian Klimmek, Shaker Verlag Aachen, 2004, for further details with reference to such an experimental design.

If use is made of a polynomial of third degree, the parameter range to be defined is subdivided into five discrete value ranges when generating the parameter variations. This serves the purpose of determining five interpolation points that are used to form polynomial functions of third degree. In the case of the double cruciform punch model, eight forecasting models are generated correspondingly, taking account of the total of eight regions of curvature for the geometric parameters, and are subsequently stored in a suitable database structure.

In conjunction with the inventive method, the geometry of a so-called test body is acquired and a finite element structure of the geometry of the test body is formed in this case. Such a test body is a practical component, for example a tailgate of a motor vehicle or the like. An example of such a tailgate is shown in a perspective view in FIG. 8 and denoted below as a test body 3. It is to be seen here that the discretization of the FEM network increases in the regions of the test body 3 where complexity of the geometry increases.

The geometry of a test body 3 corresponds at least approximately to a so-called examination body (FIG. 15) whose deformability is to be determined with the aid of the inventive method. On the basis of the finite element structure formed for the test body 3, the deformability of the test body 3 is subsequently calculated with the aid of a numerical simulation. This can be performed as a function of various materials that are designed for the test body 3. In addition, the test body 3 is assigned to a specific geometric class, the test body 3 being allocated a so-called form factor that characterizes the geometry of the test body 3. A form factor can be formed by a scalar variable. The form factor can be selected from the set of real numbers. Correspondingly, the value range extends from $-\infty$ to $+\infty$. It is important for the form factor that it characterize the specific geometry of the test body 3 with sufficient accuracy. In the field of automotive technology, it has to be understood that, for example, the form factor of a tailgate differs from that of a side sill. Within the scope of the invention, the finite element method is (FEM) can be used to calculate the deformability of a multiplicity of various test bodies that can belong to a different geometric class and correspondingly have a different form factor.

FIG. 9 and FIG. 10 show a possible organizational structure for storing a plurality of forecasting models in a data memory. FIG. 9 shows a hierarchical tree structure in which three colors for the materials A, B and C are present by way of example. The catalogs for the respective materials can be subdivided with regard to so-called categories of respective test bodies (FIG. 8). Moreover, individual categories can be further subdivided in accordance with a so-called component type. Two catalogs, specifically for category 1 and category 2, are provided by way of example in the database in the form of a so-called database for the catalog of material A. Two catalogs, specifically for a component type 1 and a component type 2, are provided, in turn, for the catalog of category 1. A catalog for a component type 3 is allocated to the catalog of category 2. The terms of category and component type are linked to the abovenamed test body (FIG. 8), and constitute various embodiments of the test body.

FIG. 10 shows a section of the database of FIG. 9 with reference to the catalog for material A. In FIG. 10, the higher level database is provided with the reference numeral 4, and is to be understood as a disk storage area in which data for the forecasting model are stored permanently and in a structured fashion. A catalog for material A, which has memory areas 5 and 6, is stored in the database 4. The data of the forecasting models of all categories for the material A are stored in the memory area 5, and the data of all reference bodies with the shape of a double cruciform punch for the material A are stored in the memory area 6.

A catalog for category 1 is provided hierarchically in the database 4 below the catalog for the material A. A memory area 7 allocated to this catalog includes the data of all the component types of category 1. Provided hierarchically below the catalog for category 1 is a further catalog for a so-called component type 1 is to which memory areas 8 and 9 are allocated. The data of a so-called test body of this component type are stored in memory area 8, and the data of a forecasting model for the test body of this component type are stored in memory area 9.

An analogous design is to be understood for the memory areas of database 3 for the catalogs of materials B and C, and is not explained again in detail in order to avoid repetitions.

The inventive method functions as follows in accordance with the flowchart of FIG. 11:

In step S1, the geometry of the test body 3 is acquired and a finite element structure is formed therefrom. As explained above with reference to FIG. 8, a so-called test body 3 is determined from a practical component that is at least similar to an examination body that is, in the final analysis, to be determined with reference to its deformability. The test body 3 is assigned in step S2 to a specific geometric class, the test body being allocated a form factor that characterizes the geometry of the test body. By way of example, the test body 3 in accordance with FIG. 8 in the form of the vehicle tailgate can have a form factor of 1.0. The form factor is a macroscopic variable with which a category of a geometry is acquired. The form factor can, for example, describe the ratio of length to width to depth of a test body 3. The form factor thus determines in advance the component category and/or the geometric relationships of the test body.

Subsequently, in step S3 the deformability of the test body is calculated on the basis of the finite element structure, specifically by means of a known FEM to method. Step S3 can be carried out repeatedly for the same test body 3, that is to say with the same geometry, in each case for various materials. Consequently, information is produced as to how the same test body appears with reference to its deformability as a function of another material. As an alternative thereto, steps S1 to S3 can also be carried out for several and/or is different test bodies that optionally consist in turn of various materials. The calculations for the various materials or various test bodies are stored in a dedicated database. This is possible, for example, in a database 4 in accordance with FIG. 6.

Steps S4 to S8 are carried out in parallel with steps S1 to S3. Added to this in detail is the fact that in step S4 a reference body 2 that consists of a selected material is deformed in a defined fashion with the aid of a test experiment as a function of at least one process parameter. The reference body consists, for example, of the blank 2 in accordance with FIG. 1a and FIG. 1b, the test experiment consisting, for example, of a double cruciform punch test in accordance with FIG. 2. The deformed regions of the reference body 2 are evaluated in step S5 in order to determine geometric parameters. These parameters are modeled on the geometric parameters, explained in FIG. 1 and FIG. 2, of the matrix 1 and matrix 1'. However, on the basis of specific forming behavior of a respective reference body 2, the deformed regions can be determined concretely with the aid of the reference body after it has been formed. Subsequently, the geometric parameters of the reference body 2 from step S5 are decoupled from absolute network coordinates of the reference body 2 in step S6, as a result of which the geometric parameters are normalized. There is then created in S7 a mathematical model, preferably a statistical forecasting model, in which the normalized geometric parameters, the at least one process parameter and the material specific parameter for the selected material of the reference body 2 are combined. To this end, reference may be made to the explanation with reference to equations 1-3 in accordance with FIG. 6 in order to avoid repetitions.

In step S8, a spatially defined region of the test body is calculated with the aid of a predetermined number of simulations on the basis of the statistical forecasting model from step S7. In the simplest case, it is enough for this purpose to use a single forecasting model, although a higher imaging accuracy is attained by using several forecasting models which respectively include different geometric parameters. It is important for the calculation in step S8 that the statistical forecasting models include only normalized geometric parameters. It is thereby possible to transfer these statistical forecasting models to a test body with any desired geometry.

A comparison is carried out in step S9 on the basis of the results from step S3 and S8, respectively. The results of the FEM calculation for the test body 3 serve as reference value for the calculation with the aid of the forecasting models from step S8. Steps S8 and S9 are repeated in step S10, a scaling of the normalized geometric parameters being undertaken in this case in step S8 with the aid of a so-called fit factor. A fit factor is a scalar variable that is multiplied by a respective normalized geometric parameter. The fit factor serves the purpose of undertaking a local adjustment of the forecasting models in order as a result to attain an adaptation to the geometric profile of the test body or of the regions of curvature thereof which is actually present. Step S10, that is to say a repetition of steps S8 and S9 including the scaling of the normalized geometric parameters in step S8, is undertaken until the result of the calculation of the test body based in the finite element method (step S3) corresponds as best as possible to the calculation based on the statistical forecasting models (step S8). By way of example, the method of least error squares is to be recommended to this end. A comparison in accordance with step S9 is shown in FIG. 12, in which a forming limit diagram with the main forming degree $\gamma_1$ is represented as a function of the secondary forming degree $\gamma_2$. Results of the calculation from step S8 are plotted in this diagram in the form of discrete points. This enables the scaling of the respective normalized geometric parameters with a fit factor in accordance with step S10. The result of a FEM simulation is shown in FIG. 13 for a test body that has been deformed by a deep drawing test, the simulation referring to the sheet thickness reduction in the respective regions of the cup. As explained above, such a FEM calculation in accordance with step S3 is used for the calculation in step S8. It has to be understood that a representation of the result in accordance with FIG. 13 is possible in the same way for a test body 3 in accordance with FIG. 8 in the form of the vehicle tailgate.

Following step S10, in step S11 the scaled parameters from step S10 are linked to the form factor from step S2 such that a matrix is formed therefrom. Such a matrix is shown by way of example in a three-dimensional diagram in FIG. 14.

In step S12, with the form factor from step S2 an examination body is correlated and/or set in context such that the statistical forecasting models based on the matrix in accordance with FIG. 12 are transferred onto the examination body in order to forecast the deformability thereof. An examination body 4 is shown in a perspective view in FIG. 15. A finite element structure is formed for the geometry of the examination body 3, the examination body 4 being allocated a form factor that characterizes the geometry of the examination body 4. Consequently, both a FEM structure and a form factor are known for the examination body 4. A comparison of the test body 3 in accordance with FIG. 8 and of the examination body 4 in accordance with FIG. 15 makes clear that even though the examination body 4 resembles the test body 3 it has a higher component complexity. Correspondingly, the examination body 4 has a different form factor that can, for example, assume the value 1.02.

For the examination body 4 whose deformability is to be determined, instead of carrying out a dedicated simulation calculation, for example on the basis of a FEM simulation or the like, only linking to the matrix in accordance with FIG. 12 is undertaken instead. Associated herewith is the fact that recourse is made for the examination body 4 to previous calculations that were undertaken for a corresponding test body on the basis of the statistical forecasting models. This previous calculation is represented by the matrix in accordance with FIG. 14, and because of step S10 has a sufficiently high mapping accuracy for it to be possible to display precise and reliable results for the examination body 4. An extremely short calculating time is rendered possible for the inventive method on the basis of recourse to the matrix of FIG. 14 for the examination body 4.

The mapping accuracy for the examination body 4 is raised by virtue of the fact that prior to step S12 a wide variation of various test bodies 3 are examined and calculated, the result being that as large a number as possible of forecasting models with different normalized geometric parameters is made available. The more these geometric parameters are differentiated in terms of their respective values, the more accurately these statistical forecasting models can be used to calculate a geometry of the test body with reference to the deformability thereof. The scaling of the normalized geometric parameters with the aid of the so-called fit factors also takes account in this case of secondary shaped elements of the test body 3 and geometric deviation from a standard shape.

The forecasting accuracy can be further raised by virtue of the fact that for the finite element structure of the examination body 4 each finite element is allocated a predetermined permissible limit value, after step S12, when the examination body 4 is linked to the matrix from step S11, each finite element of the examination body 4 being checked for the corresponding predetermined limit value. Given undershooting of this predetermined limit value with reference to a respective finite element of the examination body, a conclusion is drawn regarding at least one normalized geometric parameter such that the geometry of the examination body can be appropriately adapted.

The invention claimed is:

1. A method for determining a deformability of an examination body, comprising the steps:

i) acquiring using a computer a geometry of at least one test body and forming a finite element structure of the geometry of the test body, ii) assigning the test body to a specific geometric class, wherein a form factor that characterizes the geometry of the test body is allocated to the test body, iii) calculating the deformability of the test body on the basis of a finite element structure, iv) defined shaping of a reference body consisting of a selected material by means of a test experiment as a function of at least one process parameter, v) evaluating shaped regions of the reference body in order to determine geometric parameters, vi) decoupling the geometric parameters from absolute network coordinates of the reference body, the geometric parameters thereby being normalized, vii) creating a mathematical model in which the normalized geometric parameters, the at least one process parameter and a material specific parameter for the material of the reference body are combined, viii) calculating the deformability of the test body for a spatially defined region by means of a predetermined number of simulations based on the mathematical model from step vii), ix) comparing a result from step viii) with a result from step iii), x) repeating steps viii) and ix), a scaling of the normalized geometric parameters with a fit factor being respectively undertaken in step viii) until the result from viii) corresponds as well as possible to the result from iii), xi) linking the scaled parameters from step x) to the form factor from step ii) such that a matrix is formed therefrom, and xii) correlating the examination body with the form factor from step ii) such that the mathematic model based on the matrix from step xi) is transferred to the examination body in order to forecast the deformability thereof wherein test experiment consists of the cruciform punch test that is carried out using a cuboid reference body, and in which the cruciform punch test has geometric parameters in the form of radii at the cruciform punch (Ri), regions of curvature (Bi) and geometric measures of the cruciform punch, specifically R1: arc radius at the cruciform punch, R2: lead in radius at the cruciform punch, R3: radius at an outer face of the cruciform punch, R4: radius at an inner face of the cruciform punch, B1: concave-convex region of curvature, B2: convex-convex region of curvature, B3: concave-concave region of curvature, B4: convex-concave region of curvature, T: depth of the cruciform punch, D1: length of the cruciform punch, D2: face width of the cruciform punch, and D3: cross dimension of the cruciform punch.

2. The method as claimed in claim 1, in which in step iv) a shaping of a reference body is carried out repeatedly by means of a deviating test experiment and/or with a changed process parameter such that different normalized geometric parameters are determined subsequently in steps v) and vi).

3. The method as claimed in claim 2, in which mutually deviating test experiments are carried out on the basis of statistical experimental design.

4. The method as claimed in claim 2, in which a plurality of mathematical models are formed in step vii) on the basis of the different normalized geometric parameters and of the at least one process parameter and/or the material specific parameter.

5. The method as claimed in claim 2, in which the plurality of mathematical models from step vii) are combined in a matrix.

6. The method as claimed in claim 2, in which a further mathematical model is determined by computation using extrapolation or interpolation on the basis of two mathematical models from the plurality of mathematical models from step vii).

7. The method as claimed in claim 6, in which the extrapolation or interpolation of the further mathematical model is performed in a nonlinear fashion by a polynomial of nth degree, in particular of third degree.

8. The method as claimed in claim 6, in which the extrapolation or interpolation is carried out using I-optimal and/or D-optimal experimental designs such that in step vii) a plurality of mathematical models are created whose geometric parameters are adapted to the geometry of the test body.

9. The method as claimed in claim 1, in which when carrying out step vii) each geometric parameter that corresponds to a discrete region of curvature of the reference body is varied in an isolated fashion, and a mathematical submodel is created on the basis thereof in conjunction with remaining parameters, this mathematical submodel being considered in the calculation from step viii).

10. The method as claimed in claim 1, in which the mathematical model from step vii), and/or a mathematical submodel are/is a statistical forecasting model or a model based on a neural network.

11. The method as claimed in claim 1, comprising the steps:
    repeating steps i) to iii) for various test bodies, each test body corresponding to a dedicated geometric class, before steps vii) to xii) are respectively carried out for a corresponding test body, and
    storing the matrix from step xii) for a respective test body in a database such that this database contains a plurality of forecasting models linked to a corresponding form factor for various test bodies.

12. The method as claimed in claim 1, in which a normal direction vector that defines a material specific anisotropy is determined for the reference body, selected geometric parameters being referred to the normal direction vector.

13. The method as claimed in claim 1, in which in step vi) the geometric parameters are decoupled from the absolute space coordinates using a total differential of a local curvature of the respective deformed regions.

14. The method as claimed in claim 1, in which in step v) the curvatures of the deformed regions are combined in pairs to form specific regions of curvature, and in which the combination to form specific regions of curvature is performed on the basis of convex-convex, convex-concave, concave-convex, concave-concave, concave-flat, convex-flat, flat-convex and flat-concave pairs.

15. The method as claimed in claim 1, in which in step vii) the material specific parameter is varied by recourse to a database for various materials.

16. The method as claimed in claim 1, in which the reference body in step iv) is molten, and so a shaping of the reference body is performed by primary forming.

17. The method as claimed in claim 1, in which the reference body in step iv) is a solid body, and so the shaping of the reference body is performed by forming.

18. The method as claimed in claim 1, in which the test experiment is a double cruciform punch test in which a further, smaller cruciform punch is arranged substantially centrally inside an outer large cruciform punch, the geometry of the smaller cruciform punch being adapted to the geometry of the larger cruciform punch, and in which the double cruciform punch test has geometric parameters in the form of regions of curvature (Bi) and geometric dimensions of the cruciform punch, specifically
    B1: concave-convex region of curvature,
    B2: convex-convex region of curvature,
    B3: concave-concave region of curvature,
    B4: convex-concave region of curvature,
    B5: convex-flat region of curvature,
    B6: concave-flat region of curvature,
    B7: flat-concave region of curvature,
    B8: flat-convex region of curvature,
    T1: total depth of the cruciform punch,
    T2: depth as far as the step between the outer cruciform punch and the inner cruciform punch,
    D1: distance from the step up to an edge of the outer cruciform punch, and
    D2: punch width.

19. The method as claimed in claim 18, in which in step vii) at least eight forecasting models are created in adaptation to the regions of curvature B1-B8.

20. The method as claimed in claim 1, in which the scaling of the normalized geometric parameters in step x) is performed with the aid of the principle of least error squares, or of another calculation method for determining optima.

21. The method as claimed in claim 1, in which a finite element structure is formed for the examination body, and each finite element is allocated a predetermined permissible limit value, wherein, after step xii), when the examination body is linked to the matrix from step xi), each finite element of the examination body is checked for the corresponding predetermined limit value, and in which, given undershooting of the predetermined limit value with reference to a respective finite element of the examination body, a conclusion is drawn regarding at least one normalized geometric parameter such that the geometry of the examination body is appropriately adapted.

22. The method as claimed in claim 1, in which a finite element structure is formed for the geometry of the examination body, the examination body being allocated a form factor that characterizes the geometry of the examination body.

23. The method as claimed in claim 22, in which in step xii) the matrix from step xi) is applied to the finite element structure of the examination body, and in which the geometric differences between the examination body and the test body are taken into account by the ratio of the respectively associated form factors.

24. The method as claimed in claim 1, in which at least a portion of the method steps can be executed as a computer program on a computer or an appropriate arithmetic unit, and in which the computer program is stored on a computer-readable data medium.

25. A method for determining a deformability of an examination body, comprising the steps:
    i) acquiring a geometry of at least one test body and forming a finite element structure of the geometry of the test body,
    ii) assigning the test body to a specific geometric class, wherein a form factor that characterizes the geometry of the test body is allocated to the test body,
    iii) calculating the deformability of the test body on the basis of a finite element structure,
    iv) defined shaping of a reference body consisting of a selected material by means of a test experiment as a function of at least one process parameter,
    v) evaluating shaped regions of the reference body in order to determine geometric parameters, vi) decoupling the geometric parameters from absolute network coordinates of the reference body, the geometric parameters thereby being normalized,
vii) creating a mathematical model in which the normalized geometric parameters, the at least one process parameter and a material specific parameter for the material of the reference body are combined,
viii) calculating the deformability of the test body for a spatially defined region by means of a predetermined number of simulations based on the mathematical model from step vii),
ix) comparing a result from step viii) with a result from step iii),
x) repeating steps viii) and ix), a scaling of the normalized geometric parameters with a fit factor being respectively undertaken in step viii) until the result from viii) corresponds as well as possible to the result from iii),
xi) linking the scaled parameters from step x) to the form factor from step ii) such that a matrix is formed therefrom, and
xii) correlating the examination body with the form factor from step ii) such that the mathematic model based on the matrix from step xi) is transferred to the examination body in order to forecast the deformability thereof, wherein the test experiment consists of the cruciform punch test that is carried out using a cuboid reference body, and in which the cruciform punch test has geometric parameters in the form of radii at the cruciform punch (Ri), regions of curvature (Bi) and geometric measures of the cruciform punch, specifically R1: arc radius at the cruciform punch,
R2: lead in radius at the cruciform punch,
R3: radius at an outer face of the cruciform punch,
R4: radius at an inner face of the cruciform punch,
B1: concave-convex region of curvature,
B2: convex-convex region of curvature,
B3: concave-concave region of curvature,
B4: convex-concav region of curvature,
T: depth of the cruciform punch,
D1: length of the cruciform punch,
D2: face width of the cruciform punch, and
D3: cross dimension of the cruciform punch.

* * * * *